United States Patent
Chen et al.

(10) Patent No.: US 8,358,491 B2
(45) Date of Patent: Jan. 22, 2013

(54) OVER-VOLTAGE PROTECTION DEVICE

(75) Inventors: Yang-Yuan Chen, Tu-Cheng (TW); Heng-Chen Kuo, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 239 days.

(21) Appl. No.: 12/862,851

(22) Filed: Aug. 25, 2010

(65) Prior Publication Data

US 2011/0292552 A1    Dec. 1, 2011

(30) Foreign Application Priority Data

May 27, 2010    (TW) ................................ 99116956 A

(51) Int. Cl.
*H02H 1/00*    (2006.01)
(52) U.S. Cl. ........................................ 361/117; 361/119
(58) Field of Classification Search ........... 361/117–120
See application file for complete search history.

(56) References Cited

U.S. PATENT DOCUMENTS

| 5,326,937 | A | * | 7/1994 | Watanabe | 174/263 |
| 5,420,378 | A | * | 5/1995 | Estes et al. | 174/263 |
| 5,991,164 | A | * | 11/1999 | Saito et al. | 361/799 |
| 6,493,233 | B1 | * | 12/2002 | De Lorenzo et al. | 361/752 |

* cited by examiner

*Primary Examiner* — Danny Nguyen
(74) *Attorney, Agent, or Firm* — Altis Law Group, Inc.

(57) ABSTRACT

An exemplary over-voltage protection device used in an electronic device includes a housing capable of being grounded, a circuit board, a connecting member detachably attached to the circuit board and the housing to electrically connect the circuit board with the housing, and a protection member connected to the circuit board and circuitry of the electronic device. When an over-voltage is generated in the electronic device, the over-voltage is transmitted to the ground through the protection member, the circuit board, the connecting member, and the housing.

14 Claims, 3 Drawing Sheets

OVER-VOLTAGE PROTECTION DEVICE

BACKGROUND

1. Technical Field

The present disclosure relates to over-voltage protection devices, and particularly to an over-voltage protection device for alternating current (AC) electronic devices.

2. Description of Related Art

Generally, alternating current (AC) power supplies include over-voltage protectors. When an over-voltage is generated in an electronic device, the over-voltage protector of the electronic device can transmit the over-voltage to ground to protect the circuitry of the electronic device.

Electronic devices must pass an electrical security test before they are sold in the marketplace. In the electrical security test, activating voltages are input to an electronic device to simulate working conditions of the electronic device. However, the activating voltages may be transmitted to the ground by an over-voltage protector of the electronic device, and this may interfere with the electrical security test. Therefore the over-voltage protector should be temporarily detached from the electronic device during the electrical security test, and reattached to the electronic device after the electrical security test. The operations for detaching and reattaching the over-voltage protector generally include disassembling and reassembling the housing of the electronic device and disconnecting and reconnecting relevant circuits in the electronic device. All this needs much work; and the housing, the circuits and other components in the electronic device may be accidentally damaged in the process.

Therefore, there is room for improvement within the art.

BRIEF DESCRIPTION OF THE DRAWINGS

Many aspects of the present over-voltage protection device can be better understood with reference to the following drawings. The components in the various drawings are not necessarily drawn to scale, the emphasis instead being placed upon clearly illustrating the principles of the present over-voltage protection device. Moreover, like reference numerals designate corresponding parts throughout the drawings.

DETAILED DESCRIPTION

Figure 1:
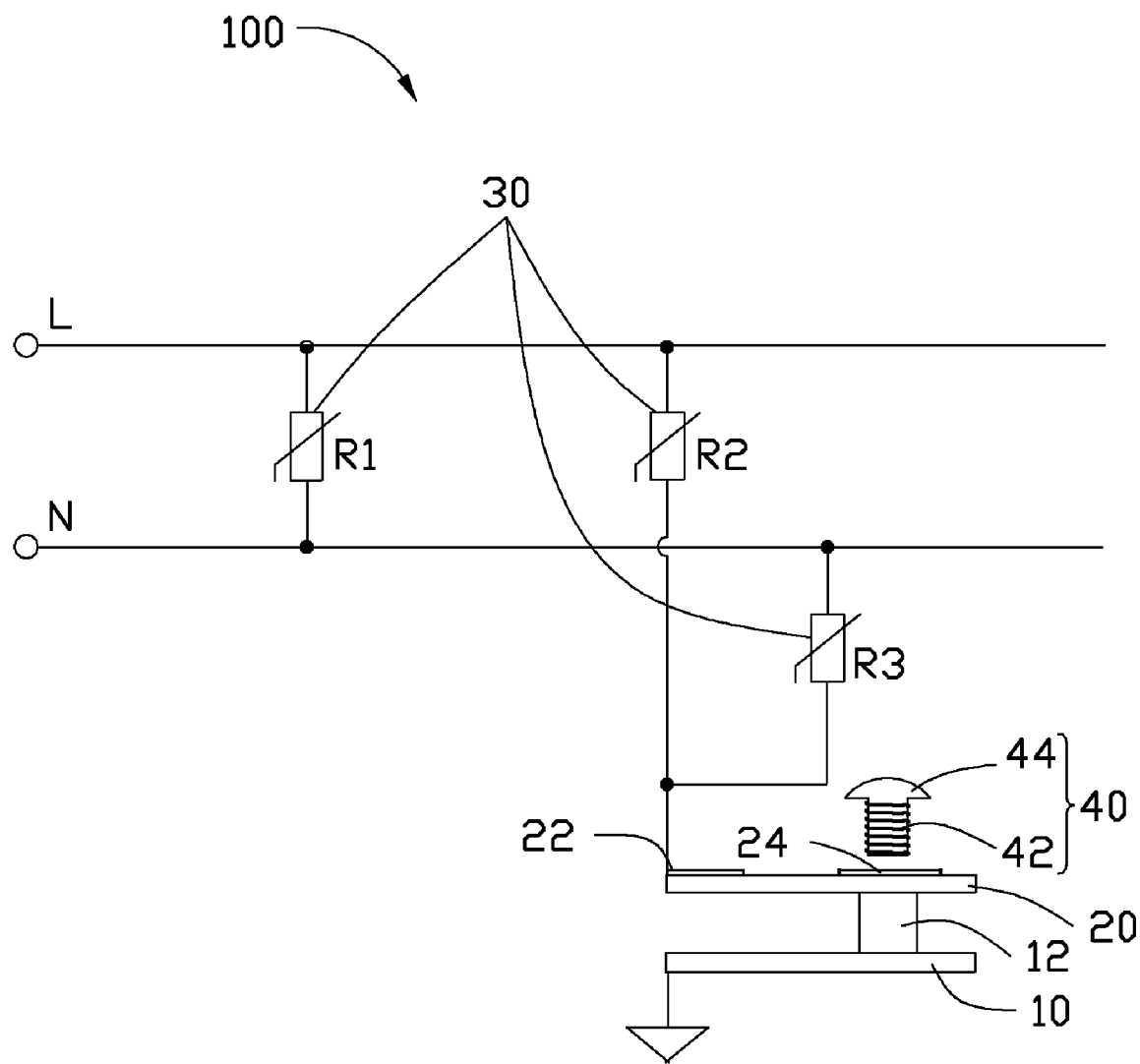
FIG. 1 is a circuit diagram of an over-voltage protection device, according to an exemplary embodiment.

FIG. 1 shows an over-voltage protection device 100, according to an exemplary embodiment. The over-voltage protection device 100 can be used in an alternating current (AC) electronic device (not shown), such as a power distribution unit (PDU). The over-voltage protection device 100 includes a housing 10, a live line L, a null line N, a circuit board 20, a protection member 30 and a connecting member 40. The live line L, the null line N, the circuit board 20, the protection member 30, and the connecting member 40 are all installed in the housing 10. The live line L and the null line N are connected to conventional circuitry (not shown) of the electronic device. In use, the electronic device is connected to its power supply by the live line L and the null line N to receive power.

The housing 10 can be a part of a housing of the AC electronic device using the over-voltage protection device 100. The housing 10 is grounded. A receiving member 12 is formed on an inner surface of the housing 10. The receiving member 12 is a hollow cylinder made of electrically conductive material. A screw thread (not labeled) is formed on an inner surface of the receiving member 12. One end of the receiving member 12 is fixed to a bottom surface of the circuit board 20.

The circuit board 20 defines an assembling hole 202 therein. The assembling hole 202 corresponds to the end of the receiving member 12 fixed to the circuit board 20, such that the assembling hole 202 communicates with the inner space of the receiving member 12. The diameter of the assembling hole 202 is equal to or greater than the inner diameter of the receiving member 12. The circuit board 20 further includes a protection connector 22 and a conducting pad 24 mounted thereon. The protection connector 22 is connected to the protection member 30. The conducting pad 24 is mounted on a top surface of the circuit board 20, and is aligned with the receiving member 12. In the illustrated embodiment, the protection connector 22 is mounted on the top surface of the circuit board 20.

Figure 2:
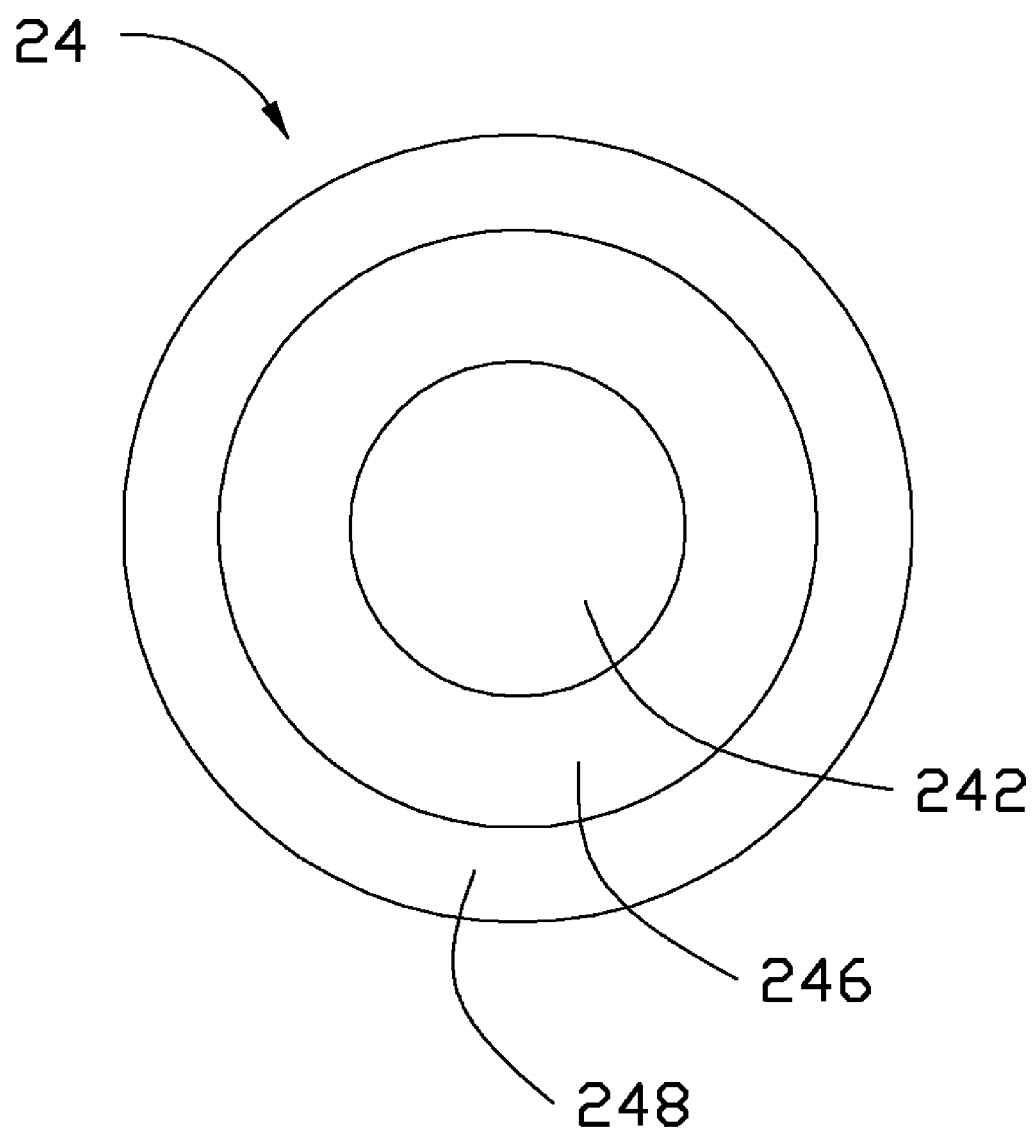
FIG. 2 is an enlarged, top view of a conducting pad of the over-voltage protection device shown in FIG. 1.
Figure 3:
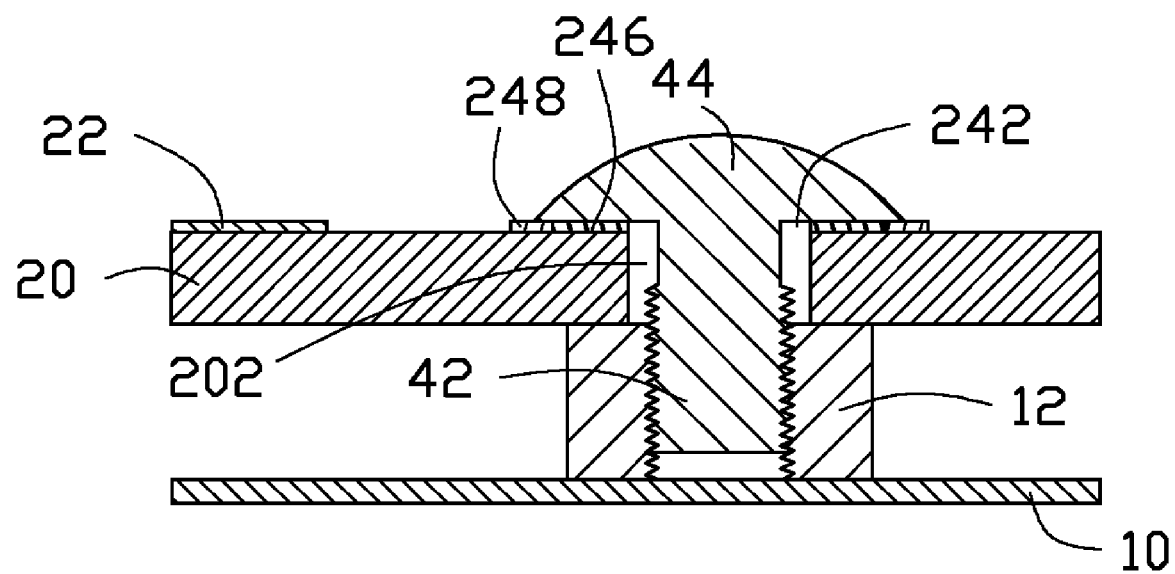
FIG. 3 is an enlarged, assembled, cutaway view of a subassembly of the over-voltage protection device shown in FIG. 1, the subassembly including a connecting member, a housing and a circuit board.

Also referring to FIG. 2, the conducting pad 24 is a round sheet. The conducting pad 24 defines a connecting hole 242 in the center thereof. The diameter of the connecting hole 242 is equal to or greater than the inner diameter of the receiving member 12. In the illustrated embodiment, the diameter of the connecting hole 242 is equal to the diameter of the assembling hole 202. The connecting hole 242 is aligned with the assembling hole 202, such that the connecting hole 242 communicates with the assembling hole 202 and the inner space of the receiving member 12. The conducting pad 24 also includes an annular insulating portion 246 formed around the connecting hole 242, and an annular conductive portion 248 formed around the insulating portion 246. The conductive portion 248 is located at the periphery of the conducting pad 24. The protection connector 22 is connected to the conductive portion 248 via circuitry of the circuit board 20.

The protection member 30 includes at least three protection components R1, R2 and R3. The protection components R1, R2 and R3 are varistors. When a high voltage is applied to the protection components R1, R2 and R3, the resistances of the protection components R1, R2 and R3 can quickly decrease. The first protection component R1 has one end connected to the live line L, and another end connected to the null line N. The second protection component R2 has one end connected to the live line L, and another end connected to the protection connector 22. The third protection component R3 has one end connected to the null line N, and another end connected to the protection connector 22.

The connecting member 40 is a bolt made of electrically conductive material. The connecting member 40 includes a connecting post 42 and a connecting head 44. The connecting post 42 is a cylinder having a screw thread (not labeled) formed thereon. The connecting post 42 is shorter than the receiving member 12, the diameter of the connecting post 42 substantially equals the inner diameter of the receiving member 12, and the screw thread of the connecting post 42 corresponds to the screw thread of the receiving member 12. Thus, the connecting post 42 can be received in the receiving member 12, with the screw thread of the connecting post 42 engaging with the screw thread of the receiving member 12 to fix the connecting post 42 in the receiving member 12. The connecting head 44 is round and coaxially extends from an end of the connecting post 42. The diameter of the connecting head 44 is larger than the outer diameter of the insulating portion 246.

In assembly, the conducting pole 40 is aligned with the connecting hole 242, and passed through the connecting hole 242 and the assembling hole 202 to be screwed into the receiving member 12. When the connecting post 42 is received in the receiving member 12 and the connecting head 44 contacts the conducting pad 24, assembly of the over-voltage protection device 100 is completed. Since the diameter of the connecting head 44 is larger than the outer diameter of the insulating portion 246, the connecting head 44 contacts the conductive portion 248, such that the conductive portion 248 is electrically connected to the receiving member 12 via the connecting member 40.

In operation, when over-voltages are generated in the electronic device and transmitted on the live line L and/or the null line N, the resistances of the protection components R1, R2 and R3 decrease to form short circuits, and therefore the live line L and the null line N are connected to each other by the short circuit formed by the protection component R1 to share the over-voltages, and the live line L and the null line N are also both connected to the protection connector 22 by the short circuits formed by the protection components R2, R3. Thus, the over-voltages can be transmitted to the protection connector 22, the circuit board 20, the conductive portion 248, the connecting head 44, the connecting post 42, the receiving member 12, and thus the housing 10 in turn and finally transmitted to ground. In this way, the electronic device using the over-voltage protection device 100 is protected from the over-voltage.

When the electrical security of the electronic device using the over-voltage protection device 100 is to be tested, the connecting member 40 is detached from the over-voltage protection device 100. Thus, the conductive portion 248 is separated from the receiving member 12, and test voltages that are applied to the live line L and/or the null line N are prevented from being transmitted to the ground via the connecting member 40 and the housing 10. When the security test is completed, the connecting member 40 is reattached, and the over-voltage protection device 100 can protect the electronic device as described above.

In alternative embodiments, the conducting pad 24 can be omitted. In such case, the insulating portion 246 is directly formed on the part of the circuit board 20 around the assembling hole 202, and the conductive portion 248 is directly formed on the part of the circuit board 20 around the insulating portion 246. In assembly, the connecting member 40 is passed through the assembling hole 202 and screwed into the receiving member 12 until the connecting head 44 contacts the conductive portion 248 on the circuit board 20. Thus, the over-voltage protection device 100 can protect the electronic device in much the same way as described above.

In the above-described embodiments, the connecting member 40 is detached from the over-voltage protection device 100 during the electrical security test of the electronic device and reattached to the over-voltage protection device 100 after the electrical security test. Thus, the over-voltage protection device 100 can protect the electronic device from over-voltages, and also does not interfere with the electrical security test of the electronic device. Unlike with conventional over-voltage protection devices, the over-voltage protection device 100 does not need to be completely detached from and reattached to the electronic device. Rather, only the connecting member 40 of the over-voltage protection device 100 needs to be detached and reattached. In addition, the detaching and reattaching operations on the over-voltage protection device 100 are simple and straightforward, and minimize the risk of accidental damage occurring to components of the electronic device during such operations.

It is to be further understood that even though numerous characteristics and advantages of the present embodiments have been set forth in the foregoing description, together with details of structures and functions of the various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An over-voltage protection device used in an electronic device, comprising:
    a housing, which is capable of being connected to ground or serving as electrical ground;
    a circuit board;
    a connecting member detachably attached to the circuit board and the housing to electrically connect the circuit board with the housing;
    a protection member connected to the circuit board and circuitry of the electronic device; wherein when an over-voltage is generated in the electronic device, the over-voltage is transmitted to the ground through the protection member, the circuit board, the connecting member, and the housing;
    a live line connected to the circuitry of the electronic device and the protection member; and
    a null line connected to the circuitry of the electronic device and the protection member;
    wherein the protection member includes at least three protection components, one protection component connecting the live line to the null line, one protection component connecting the live line to the circuit board, and one protection component connecting the null line to the circuit board.

2. The over-voltage protection device of claim 1, wherein the housing includes a hollow receiving member, with one end of the receiving member fixed to the circuit board.

3. The over-voltage protection device of claim 2, wherein the connecting member is a bolt including a screw thread formed thereon, the receiving member including screw thread formed on an inner surface thereof, and the screw thread of the connecting member engages with the screw thread of the receiving member to detachably assemble the connecting member to the housing.

4. The over-voltage protection device of claim 3, wherein the connecting member includes a connecting post and a connecting head, the screw thread of the connecting member formed on the connecting post, the connecting head being round and coaxially extending from an end of the connecting post, and the connecting head contacting the circuit board to electrically connect the circuit board with the housing.

5. The over-voltage protection device of claim 4, wherein the circuit board defines an assembling hole communicating with the inner space of the receiving member, and includes an insulating portion formed around the assembling hole and a conductive portion formed around the insulating portion, the connecting member screwed into the receiving member through the assembling hole to be assembled to the circuit board and electrically connected to the housing, with the connecting head contacting the conductive portion to electrically connect the circuit board with the housing.

6. The over-voltage protection device of claim 4, wherein the circuit board defines an assembling hole communicating with the inner space of the receiving member and includes a conducting pad, the conducting pad defining a connecting hole communicating with the assembling hole and thereby with the inner space of the receiving member, and including an insulating portion formed around the assembling hole and a conductive portion formed around the insulating portion; and the connecting member is screwed into the receiving member through the connecting hole and the assembling hole to be assembled to the circuit board and electrically connected to the housing, with the connecting head contacting the conductive portion to electrically connect the circuit board with the housing.

7. The over-voltage protection device of claim 1, wherein the protection components are varistors, and when the over-voltage is generated in the electronic device, the over-voltage is transmitted from the live line and the null line to the protection components, the resistances of the protection components decrease to form short circuits, and the live line and the null line are connected to the circuit board by the short circuits to transmit the over-voltages to ground through the circuit board, the connecting member, and the housing.

8. An over-voltage protection device for use in an electronic device, comprising:
   a housing portion, which is capable of being connected to ground or serving as electrical ground;
   a circuit board;
   a connecting member detachably attached to the circuit board and the housing to electrically connect the circuit board with the housing;
   a protection member connected to the circuit board and configured to be connected to circuitry of the electronic device; wherein when an over-voltage is generated in the electronic device, the over-voltage can be transmitted to ground through the protection member, the circuit board, the connecting member, and the housing;
   a live line configured to be connected to the circuitry of the electronic device, and connected to the protection member; and
   a null line configured to be connected to the circuitry of the electronic device, and connected to the protection member;
   wherein the protection member includes at least three protection components, one protection component connecting the live line to the null line, one protection component connecting the live line to the circuit board, and one protection component connecting the null line to the circuit board.

9. The over-voltage protection device of claim 8, wherein the housing includes a hollow receiving member, with one end of the receiving member fixed to the circuit board.

10. The over-voltage protection device of claim 9, wherein the connecting member is a bolt including a screw thread formed thereon, the receiving member including screw thread formed on an inner surface thereof, and the screw thread of the connecting member engages with the screw thread of the receiving member to detachably assemble the connecting member to the housing.

11. The over-voltage protection device of claim 10, wherein the connecting member includes a connecting post and a connecting head, the screw thread of the connecting member formed on the connecting post, the connecting head being round and coaxially extending from an end of the connecting post, and the connecting head contacting the circuit board to electrically connect the circuit board with the housing.

12. The over-voltage protection device of claim 11, wherein the circuit board defines an assembling hole communicating with the inner space of the receiving member, and includes an insulating portion formed around the assembling hole and a conductive portion formed around the insulating portion, the connecting member screwed into the receiving member through the assembling hole to be assembled to the circuit board and electrically connected to the housing, with the connecting head contacting the conductive portion to electrically connect the circuit board with the housing.

13. The over-voltage protection device of claim 11, wherein the circuit board defines an assembling hole communicating with the inner space of the receiving member and includes a conducting pad, the conducting pad defining a connecting hole communicating with the assembling hole and thereby with the inner space of the receiving member, and including an insulating portion formed around the assembling hole and a conductive portion formed around the insulating portion; and the connecting member is screwed into the receiving member through the connecting hole and the assembling hole to be assembled to the circuit board and electrically connected to the housing, with the connecting head contacting the conductive portion to electrically connect the circuit board with the housing.

14. The over-voltage protection device of claim 8, wherein the protection components are varistors, and when the over-voltage is generated in the electronic device, the over-voltage can be transmitted from the live line and the null line to the protection components, whereupon the resistances of the protection components decrease to form short circuits, and the live line and the null line are connected to the circuit board by the short circuits to transmit the over-voltages to ground through the circuit board, the connecting member, and the housing.

* * * * *